US012658096B2

(12) United States Patent (10) Patent No.: US 12,658,096 B2
Kim et al. (45) Date of Patent: Jun. 16, 2026

(54) DISPLAY MODULE AND DISPLAY DEVICE INCLUDING THE SAME

(71) Applicant: Samsung Display Co., LTD., Yongin-si (KR)

(72) Inventors: Tae Kwang Kim, Yongin-si (KR); Kyu Bong Jung, Yongin-si (KR); Ji Hun Kim, Yongin-si (KR); Hun Tae Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/922,197

(22) Filed: Oct. 21, 2024

(65) Prior Publication Data

US 2025/0336332 A1 Oct. 30, 2025

(30) Foreign Application Priority Data

Apr. 29, 2024 (KR) ........................ 10-2024-0056810

(51) Int. Cl.
*G09G 3/20* (2006.01)
*G02B 1/14* (2015.01)
*G06F 3/0488* (2022.01)
*H05K 1/18* (2006.01)

(52) U.S. Cl.
CPC ............. *G09G 3/2092* (2013.01); *G02B 1/14* (2015.01); *G06F 3/0488* (2013.01); *H05K 1/18* (2013.01); *G09G 2310/0267* (2013.01); *G09G 2310/0272* (2013.01); *H05K 2201/10128* (2013.01)

(58) Field of Classification Search
CPC ......... G09G 3/2092; G09G 2310/0267; G09G 2310/0272; G02B 1/14; G06F 3/0488; H05K 1/18; H05K 2201/10128
See application file for complete search history.

(56) References Cited

U.S. PATENT DOCUMENTS

| | | | | |
|---|---|---|---|---|
| 11,455,005 B2 * | 9/2022 | Seo | ....................... | G06F 1/1637 |
| 11,464,105 B2 | 10/2022 | Lee | | |
| 2016/0333232 A1 * | 11/2016 | Choi | ........................... | C09J 7/26 |
| 2018/0074377 A1 * | 3/2018 | You | ........................... | C08J 5/12 |
| 2020/0381661 A1 * | 12/2020 | Lee | .................... | H10K 59/8722 |
| 2021/0375166 A1 * | 12/2021 | Park | ..................... | G06F 1/1658 |
| 2021/0397218 A1 * | 12/2021 | Seo | ....................... | G06F 1/1616 |

(Continued)

FOREIGN PATENT DOCUMENTS

| | | |
|---|---|---|
| CN | 115620638 A | 1/2023 |
| KR | 10-2021-0104214 A | 8/2021 |

(Continued)

*Primary Examiner* — Sejoon Ahn
(74) *Attorney, Agent, or Firm* — Womble Bond Dickinson (US) LLP

(57) ABSTRACT

A display module includes a panel including a plurality of pixels, a plate overlapping with the panel, the plate configured to protect the panel from external impact, a printed circuit board configured to generate signals for driving the plurality of pixels, and an adhesive layer between the plate and the printed circuit board, wherein the adhesive layer includes a first adhesive layer and a second adhesive layer adhering the plate and the printed circuit board to each other, and wherein, in a partial region of the adhesive layer, the first adhesive layer and the second adhesive layer are positioned while being mixed together.

17 Claims, 9 Drawing Sheets

(56)        References Cited

U.S. PATENT DOCUMENTS

| | | | | |
|---|---|---|---|---|
| 2022/0046811 A1* | 2/2022 | Kim | .................... | G06F 1/1652 |
| 2022/0129040 A1* | 4/2022 | Kim | .................... | G06F 1/1652 |
| 2022/0377908 A1 | 11/2022 | Kim et al. | | |
| 2023/0005899 A1* | 1/2023 | Kim | .................... | H01L 25/0753 |
| 2023/0136429 A1 | 5/2023 | Park et al. | | |

FOREIGN PATENT DOCUMENTS

| | | |
|---|---|---|
| KR | 10-2022-0158186 A | 11/2022 |
| KR | 10-2023-0065438 A | 5/2023 |

* cited by examiner

FIG. 1

DD 110
120
130
140
150
160
170
210
180
PR
220
Pressure

DR3
DR2
DR1

100: 110, 120, 130, 140, 150, 160, 170, 180
200: 210, 220

DD

PR 110
120
130
140
150
160
170
180

210

220

Pressure

SC: CL1, CL2
TX: TX1~TXq
RX: RX1~RXp

161     PR     162

150

170

160: 161, 162

DR3

DR1 → DR2

300

US1

310
320

LS1

DR3

DR1 → DR2

160: 161, 162

160: 161, 162
162: 162a, 162b

160: 161, 162
162: 162a, 162b

DR1

DR3 DR2

160: 161, 162
162: 162a, 162b, 162c

DISPLAY MODULE AND DISPLAY DEVICE INCLUDING THE SAME

CROSS-REFERENCE TO RELATED APPLICATION

The present application claims priority to and the benefit of Korean Patent Application No. 10-2024-0056810, filed on Apr. 29, 2024, in the Korean Intellectual Property Office, the entire disclosure of which is incorporated herein by reference.

BACKGROUND

1. Field

Aspects of the present disclosure generally relate to a display module and a display device including the same.

2. Description of the Related Art

In general, a display device includes a display module for displaying an image and a set connected to the display module. The set provides the display module with a driving signal for driving the display module. The display module may be driven by the set, to display an image.

The set may be separately manufactured to be connected to the display module. In a process of connecting the set and the display module to each other, using a connector, pressure is applied to the display module, and therefore, a front surface of the display module may be pressed by the pressure.

The above information disclosed in this Related Art section is only for enhancement of understanding of the background of the disclosure and therefore it may contain information that does not form the prior art that is already known in this country to a person of ordinary skill in the art.

SUMMARY

Aspects of embodiments of the present disclosure are directed to a display module and a display device including the same, in which the durability of the display module is enhanced, so that the display module can be prevented from being damaged or pressed due to pressure, or such damage may be significantly reduced.

According to some embodiments of the present disclosure, there is provided a display module including: a panel including a plurality of pixels; a plate overlapping with the panel, the plate configured to protect the panel from external impact; a printed circuit board configured to generate signals for driving the plurality of pixels; and an adhesive layer between the plate and the printed circuit board, wherein the adhesive layer includes: a first adhesive layer; and a second adhesive layer adhering the plate and the printed circuit board to each other, and wherein, in a partial region of the adhesive layer, the first adhesive layer and the second adhesive layer are positioned while being mixed together.

In some embodiments, the adhesive layer and the printed circuit board overlap each other in a third direction, and, in the partial region of the adhesive layer, the first adhesive layer and the second adhesive layer overlap each other in a first direction perpendicular to the third direction.

In some embodiments, in the partial region of the adhesive layer, a width of the first adhesive layer in the first direction is greater than a width of the second adhesive layer in the first direction.

In some embodiments, in a region except the partial region of the adhesive layer, any one of the first adhesive layer and the second adhesive layer is positioned.

In some embodiments, the first adhesive layer includes: a first material layer; and a first conductive adhesive having adhesion, and wherein the first adhesive layer is attached to the printed circuit board through the first conductive adhesive.

In some embodiments, the second adhesive layer includes: a second conductive adhesive and a third conductive adhesive, which have adhesion; and a second material layer between the second conductive adhesive and the third conductive adhesive.

In some embodiments, the first material layer includes polyethylene terephthalate (PET), and the second material layer includes a non-woven fabric.

In some embodiments, the second adhesive layer includes a first sub-adhesive layer and a second sub-adhesive layer spaced apart from the first adhesive layer, and, in the partial region of the adhesive layer, the first adhesive layer and the first sub-adhesive layer are positioned while being mixed together.

In some embodiments, in a region except the partial region of the adhesive layer, any one of the first adhesive layer and the second sub-adhesive layer is positioned.

In some embodiments, the adhesive layer and the printed circuit board overlap each other in a third direction, and, in the partial region of the adhesive layer, the first adhesive layer and the first sub-adhesive layer overlap each other at three surfaces in a first direction crossing the third direction and a second direction crossing the third direction.

In some embodiments, the second adhesive layer further includes the first sub-adhesive layer and a third sub-adhesive layer spaced apart from the second sub-adhesive layer, the partial region of the adhesive layer includes a first region and a second region not overlapping with the first region, wherein, in the first region, the first adhesive layer and the first sub-adhesive layer are positioned while being mixed together, and wherein, in the second region, the first adhesive layer and the third sub-adhesive layer are positioned while being mixed together.

According to some embodiments of the present disclosure, there is provided a display device including: a display module configured to display an image; and a set configured to provide external signals to the display module, wherein the display module includes: a panel including a plurality of pixels; a plate overlapping with the panel, the plate configured to protect the panel from external impact; a printed circuit board configured to generate signals for driving the plurality of pixels based on the external signals; and an adhesive layer between the plate and the printed circuit board, wherein the adhesive layer includes: a first adhesive layer; and a second adhesive layer adhering the plate and the printed circuit board to each other, and wherein, in a partial region of the adhesive layer, the first adhesive layer and the second adhesive layer are positioned while being mixed together.

In some embodiments, the adhesive layer and the printed circuit board overlap each other in a third direction, and, in the partial region of the adhesive layer, the first adhesive layer and the second adhesive layer overlap each other in a first direction perpendicular to the third direction.

In some embodiments, the display module further includes a display connector electrically connected to the printed circuit board, the set includes a set connector connected between the set and the display connector, and the partial region of the adhesive layer overlaps with a position at which the display connector and the set connector are fastened to each other in the third direction.

In some embodiments, in the partial region of the adhesive layer, a width of the first adhesive layer in the first direction is greater than a width of the second adhesive layer in the first direction.

In some embodiments, in a region except the partial region of the adhesive layer, any one of the first adhesive layer and the second adhesive layer is positioned.

In some embodiments, the first adhesive layer includes: a first material layer; and a first conductive adhesive having adhesion, and wherein the first adhesive layer is attached to the printed circuit board through the first conductive adhesive.

In some embodiments, the second adhesive layer includes: a second conductive adhesive and a third conductive adhesive, which have adhesion; and a second material layer between the second conductive adhesive and the third conductive adhesive.

In some embodiments, the first material layer includes polyethylene terephthalate (PET), and the second material layer includes a non-woven fabric.

BRIEF DESCRIPTION OF THE DRAWINGS

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art.

In the drawing figures, dimensions may be exaggerated for clarity of illustration.

FIGS. 1 and 2 are views illustrating a display device according to some embodiments of the present disclosure.

FIG. 3 is a schematic view illustrating a panel and a printed circuit board of the display device of FIG. 1, according to some embodiments of the present disclosure.

DETAILED DESCRIPTION

Figure 2:
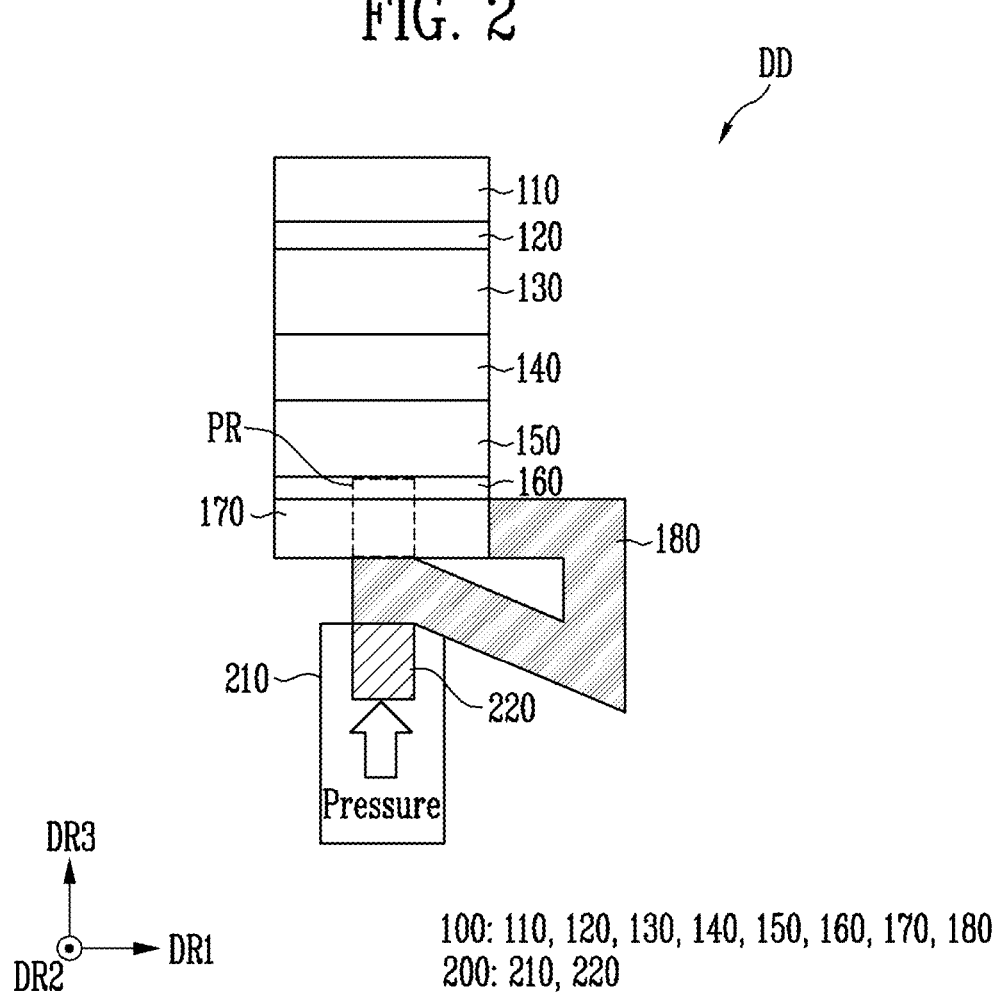

Hereinafter, embodiments of the present disclosure will be described in more detail with reference to the accompanying drawings. The description below may focus primarily on parts that are necessary to understand an operation according to the present disclosure and the descriptions of other parts may be omitted in order not to unnecessarily obscure subject matters of the present disclosure. In addition, the present disclosure is not limited to exemplary embodiments described herein, but may be embodied in various different forms. Rather, exemplary embodiments described herein are provided to thoroughly and completely describe the disclosed contents and to sufficiently transfer the ideas of the disclosure to a person of ordinary skill in the art.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept.

It will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," "comprising," "has," "have," and "having," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For example, the expression "A and/or B" denotes A, B, or A and B. Expressions such as "one or more of" and "at least one of," when preceding a list of elements, modify the entire list of elements and do not modify the individual elements of the list. For example, the expression "one or more of A, B, and C," "at least one of A, B, or C," "at least one of A, B, and C," and "at least one selected from the group consisting of A, B, and C" indicates only A, only B, only C, both A and B, both A and C, both B and C, or all of A, B, and C.

Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", "in contact with", "in direct contact with", or "immediately adjacent" another element or layer, there are no intervening elements or layers present.

As used herein, the terms "use," "using," and "used" may be considered synonymous with the terms "utilize," "utilizing," and "utilized," respectively.

Spatially relative terms, such as "below," "above," and the like, may be used herein for ease of description to describe the relationship of one element to another element, as illustrated in the figures. It will be understood that the spatially relative terms, as well as the illustrated configurations, are intended to encompass different orientations of the apparatus in use or operation in addition to the orientations described herein and depicted in the figures. For example, if the apparatus in the figures is turned over, elements described as "below" or "beneath" other elements or features would then be oriented "above" the other elements or features. Thus, the exemplary term, "above," may encompass both an orientation of above and below. The apparatus may be otherwise oriented (e.g., rotated 90 degrees or at other orientations) and the spatially relative descriptors used herein interpreted accordingly.

In addition, the embodiments of the disclosure are described here with reference to schematic diagrams of ideal embodiments (and an intermediate structure) of the present disclosure, so that changes in a shape as shown due to, for example, manufacturing technology and/or a tolerance may be expected. Therefore, the embodiments of the present disclosure shall not be limited to the specific shapes of a region shown here, but include shape deviations caused by, for example, the manufacturing technology. The regions shown in the drawings are schematic in nature, and the shapes thereof do not represent the actual shapes of the regions of the device, and do not limit the scope of the disclosure.

Figure 1:
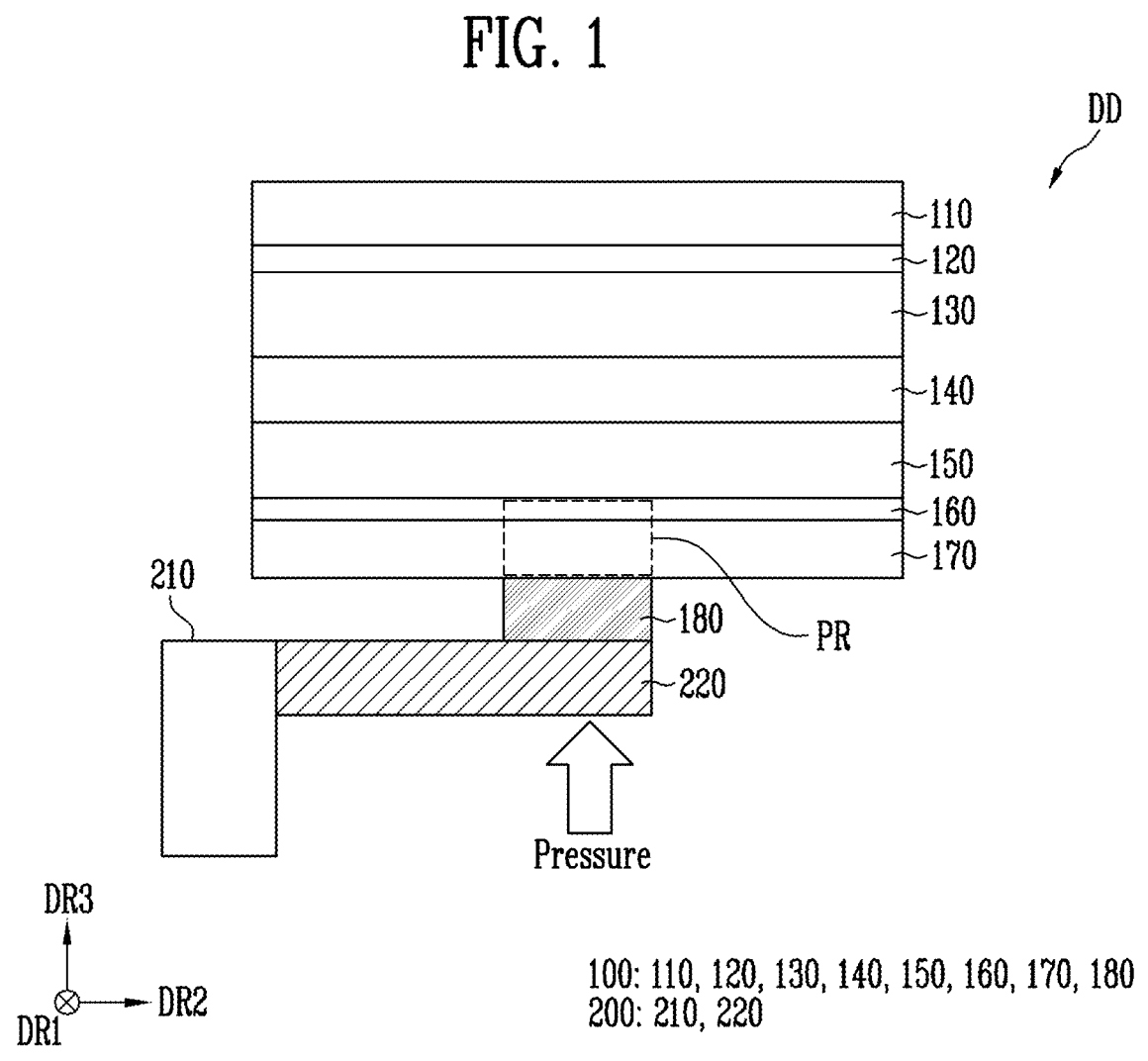

FIGS. 1 and 2 are views illustrating a display device according to some embodiments of the present disclosure.

Referring to FIGS. 1 and 2, the display device DD may include a display module 100 and a set 200.

The display module 100 may include a protective layer 110, a window 120, a polarizing plate 130, a panel 140, a plate 150, an adhesive layer 160, a printed circuit board 170, and a display connector 180.

The set 200 may include a set body 210 and a set connector 220.

The protective layer 110 is a protective member disposed at an uppermost end of the display module 100, and may be a substantially transparent light transmitting substrate. The protective layer 110 may protect components disposed under the protective layer 110 from external factors (e.g., infiltration of external moisture and oxygen, external physical impact, and the like).

The window 120 may be disposed to overlap with the protective layer 110. The window 120 may be a substantially transparent light transmitting substrate. The window 120 may have a multi-layer structure selected from a glass substrate, a plastic film, and a plastic substrate. The window 120 may include a rigid or flexible base material, and the material constituting the window 120 is not particularly limited.

The polarizing plate 130 may be disposed to overlap with the window 120. The polarizing plate 130 may be attached to an outer surface of the panel 140 so as to improve ambient visibility such as blocking of external light reflection. The polarizing plate 130 and the panel 140 may go through a process in which the polarizing plate 130 and the panel 140 are separately manufactured and then attached to each other or assembled.

The panel 140 may be disposed to overlap with the polarizing plate 130. The panel 140 will be described in further detail later with reference to FIGS. 3 to 5.

The plate 150 may be disposed to overlap with the panel 140. The plate 150 may include a metallic material (e.g., aluminum). The plate 150 may protect the panel 140 from external impact (e.g., external physical impact). In some embodiments, the plate 150 may have various suitable thicknesses in a third direction DR3.

The adhesive layer 160 may be disposed between the plate 150 and the printed circuit board 170. The plate 150 may be adhered to the printed circuit board 170 through the adhesive layer 160.

Figures 6, 7:
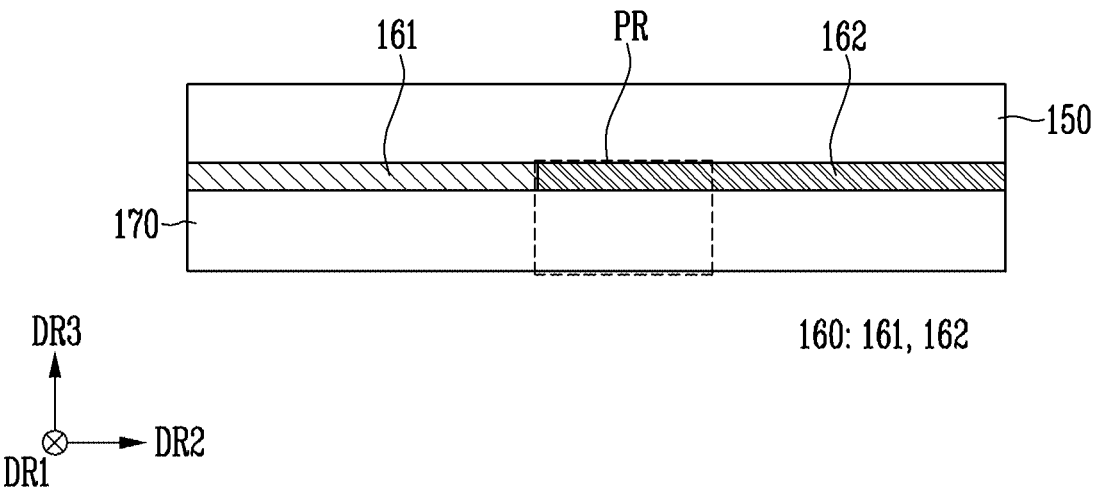
FIG. 6 is a schematic view illustrating a plate, an adhesive layer, and a printed circuit board of the display device shown in FIG. 1, which are viewed in a first direction, according to some embodiments of the present disclosure.
FIG. 7 is a schematic view illustrating a first tape constituting a first adhesive layer shown in FIG. 6, according to some embodiments of the present disclosure.

The adhesive layer 160 may include a first adhesive layer 161 (see, e.g., FIG. 6) and a second adhesive layer 162 (see, e.g., FIG. 6). The first adhesive layer 161 and the second adhesive layer 162 will be described later with reference to FIG. 6.

The printed circuit board 170 may be disposed to overlap with the adhesive layer 160. The printed circuit board 170 may receive external signals from the set 200, to generate signals for driving a plurality of pixels PX (see, e.g., FIG. 3). Also, the printed circuit board 170 may drive the panel 140, to sense a touch. This will be described in further detail later with reference to FIGS. 4 and 5.

One side of the display connector 180 may be connected to the printed circuit board 170. One side of the set connector 220 may be connected to the set body 210. The other side of the display connector 180 may be electrically connected to the other side of the printed circuit board 170. The printed circuit board 170 and the set body 210 may be connected to each other through an electrical connection between the display connector 180 and the set connector 220. The printed circuit board 170 may receive external signals (e.g., a vertical synchronization signal Vsync and/or the like) through the display connector 180 and the set connector 220.

The display connector 180 and the set connector 220 may include a flexible material. The display connector 180 and the set connector 220 may be bent with a predetermined curvature.

The set body 210 may provide the external signals (e.g., the vertical synchronization signal Vsync and/or the like) to the printed circuit board 170 through the set connector 220 and the display connector 180.

In a process in which the set connector 220 and the display connector 180 are fastened (or electrically connected) to each other, an unintended pressure Pressure may be applied to the printed circuit board 170 and the adhesive layer 160 (see an arrow). In addition, the printed circuit board 170 and the adhesive layer 160 may include a pressurized region PR to which the unintended pressure Pressure is applied. In the process, the pressure Pressure applied to the printed circuit board 170 and the adhesive layer 160 may be transferred to the protective layer 110. In addition, the protective layer 110 may be damaged (e.g., pressed) by the pressure Pressure.

The display module in accordance with the embodiments of the present disclosure can reduce (e.g., minimize) transfer of the pressure Pressure up to the protective layer 110 by the adhesive layer 160. Accordingly, damage of the protective layer 110 can be prevented or substantially reduced. This will be described in further detail later with reference to FIGS. 9, 11, and 12.

Figure 3:
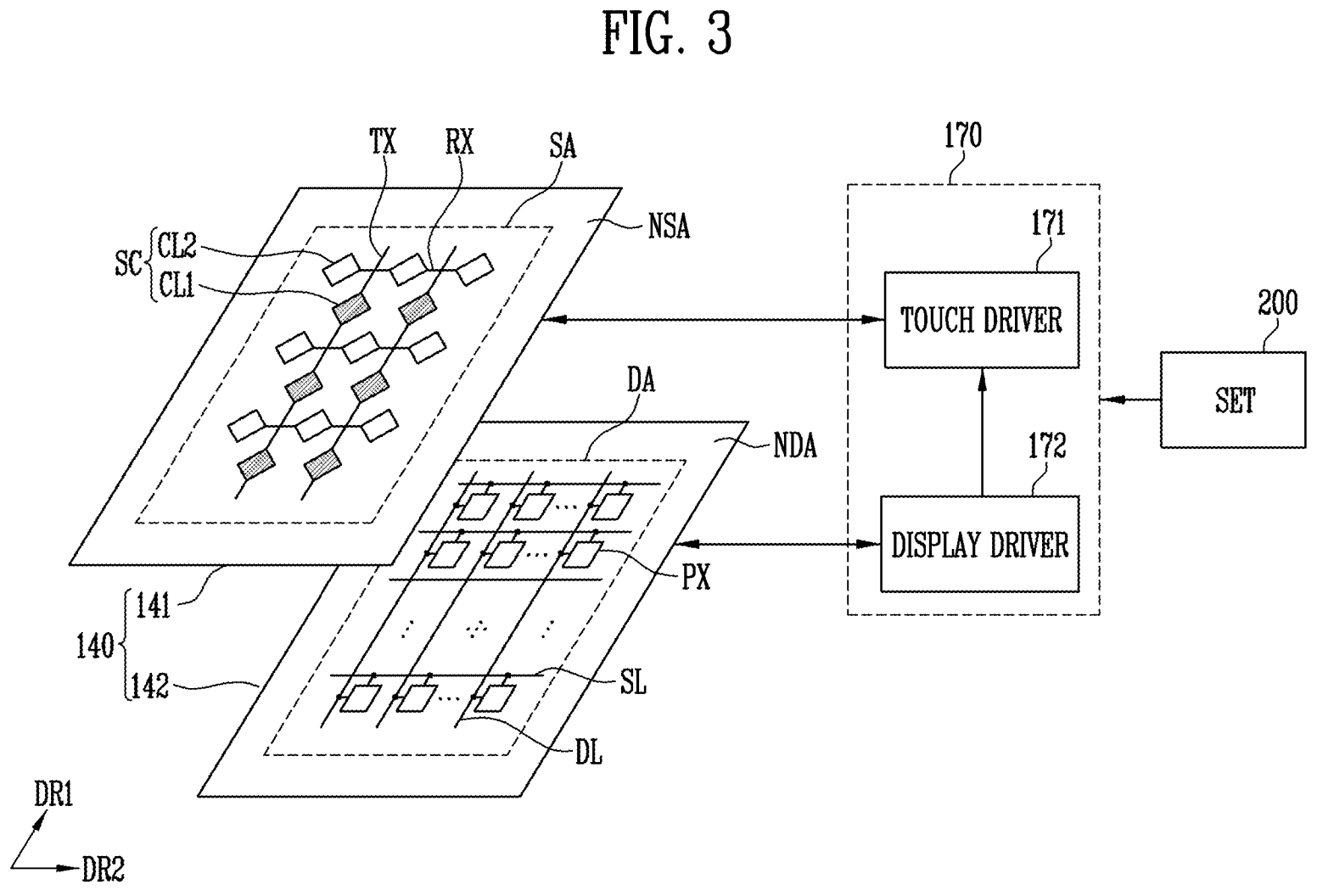

FIG. 3 is a schematic view illustrating the panel and the printed circuit board of the display device of FIG. 1, according to some embodiments of the present disclosure.

Referring to FIGS. 1 and 3, the panel 140 may include a touch array 141 and a display panel 142 overlapping with the touch array 141. The printed circuit board 170 may include a touch driver 171, a display driver 172, and the like.

The touch array 141 may include an active area SA capable of sensing a touch and a non-active area NSA at the periphery of the active area SA. The active area SA may at least partially overlap with a display area DA.

The touch array 141 may include a substrate and touch electrodes formed on the substrate. In some embodiments, the touch electrodes may include driving electrodes TX and sensing electrodes RX. The driving electrodes TX may include first cells CL1. The sensing electrodes RX may include second cells CL2. The driving electrodes TX and the sensing electrodes RX may be disposed in the active area SA on the substrate. In some embodiments, the substrate may be a rigid substrate including a material such as glass or tempered glass. In some other embodiments, the substrate may be a flexible substrate including a material such as plastic or metal. In some embodiments, at least one layer included in the display panel 142 may be used as the substrate of the touch array 141.

In some embodiments, the touch array 141 and the display panel 14 may be manufactured separately from each other and then coupled to each other to at least partially overlap with each other. In some other embodiments, the touch array 141 and the display panel 142 may be integrally manufactured. The touch array 141 may be formed directly on at least one layer included in the display panel 142, for example, an upper substrate, a thin film encapsulation layer, or an insulating layer of the display panel 142.

In FIG. 3, it is illustrated that the touch array 141 disposed on the display panel 142. However, the touch array 141 is not limited thereto. For example, the touch array 141 may be disposed under the display panel 142.

The display panel 142 may include the display area DA for displaying an image and a non-display area NDA at the periphery of the display area DA. The non-display area NDA may at least partially surround the display area DA. The display panel 142 may include pixels PX formed on a substrate. The pixels PX may be disposed in the display area DA. In some embodiments, the substrate may be a rigid substrate including a material such as glass or tempered glass. In some other embodiments, the substrate may be a flexible substrate including a material such as plastic or metal.

The pixels PX are connected to driving lines SL and data lines DL. The pixels PX are selected by a driving signal having a turn-on level supplied through the driving lines SL, and receive data signals through the data lines DL. Accordingly, the pixels PX emit lights with luminance corresponding to the data signals, and an image is displayed in the display area DA.

Lines and/or a built-in circuit, connected to the pixels PX, may be disposed in the non-display area NDA. For example, a scan driver may be further disposed in the non-display area NDA.

In some embodiments, the display panel 142 may include, as the pixels PX, organic light emitting diodes, inorganic light emitting diodes, quantum dot/well light emitting diodes, and the like. In some other embodiments, the display panel 142 may be implemented as a liquid crystal display panel. A light source such as a backlight unit may be additionally included.

In some embodiments, the touch driver 171 and the display driver 172 may be configured as integrated chips (ICs) separate from each other. In some other embodiments, the touch driver 171 and the display driver 172 may be mounted in one IC.

The touch driver 171 may be connected to the touch array 141 to drive the touch array 141 based on (e.g., using) a driving signal.

The display driver 172 may be electrically connected to the display panel 142 to drive the pixels PX. For example, the display driver 172 may include a data driver connected to the data lines DL, the scan driver connected to the driving lines SL, and a timing controller which controls the data driver and the scan driver. In another example, the display driver 172 may include the data driver and the timing controller, and the scan driver may be disposed in the non-display area NDA of the display panel 142.

The display driver 172 may display an image by using a display frame period as a unit. The touch driver 171 may sense a touch by using a sensing frame period as a unit. The sensing frame period and the display frame period may be synchronized with each other or be unsynchronized.

Figure 4:
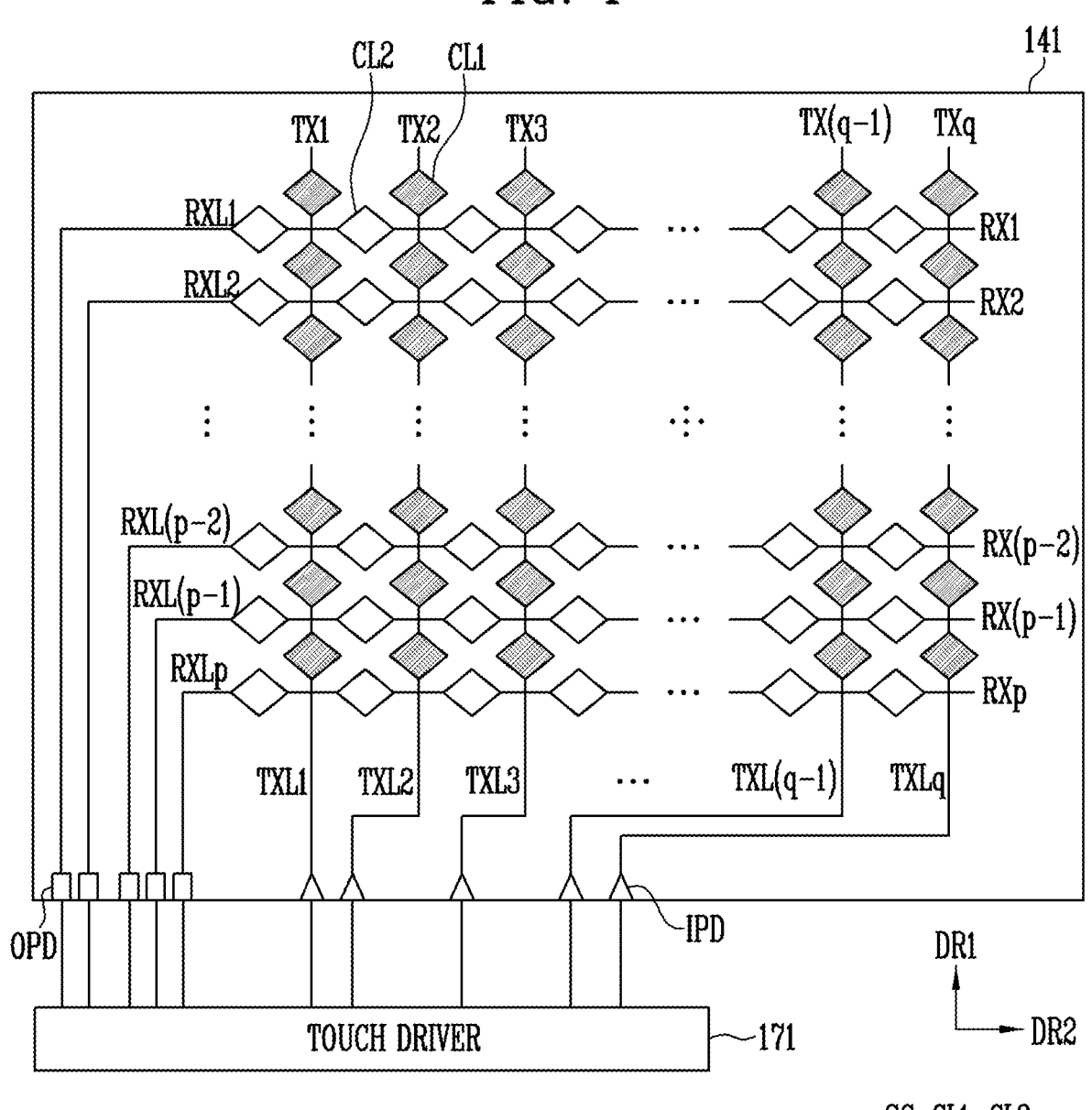
FIG. 4 is a schematic view illustrating a touch array and a touch driver of the display device of FIG. 3, according to some embodiments of the present disclosure.

FIG. 4 is a schematic view illustrating the touch array and the touch driver, which are shown in FIG. 3, according to some embodiments of the present disclosure.

Referring to FIGS. 3 and 4, the touch array 141 may include driving electrodes TR and sensing electrodes RX. The driving electrodes TX may include first to qth (where q is a positive integer greater than one) driving electrodes TX1 to TXq. The sensing electrodes RX may include first to pth (where p is a positive integer greater than one) sensing electrodes RX1 to RXp.

The first to qth driving electrodes TX1 to TXq may be connected to first to qth driving lines TXL1 to TXLq, respectively. The first to pth sensing electrodes RX1 to RXp may be connected to first to pth sensing lines RXL1 to RXLp, respectively.

Each of the first to qth driving electrodes TX1 to TXq may include first cells CL1, which are arranged in a first direction DR1 and are electrically connected to each other, and each of the first to pth sensing electrodes RX1 to RXp may include second cells CL2, which are arranged in a second direction DR2 and are electrically connected to each other. In FIG. 4, it is illustrated that each of the first cells CL1 and the second cells CL2 has a diamond shape. However, embodiments of the present disclosure are not limited thereto. For example, each of the first cells CL1 and the second cells CL2 may have at least one of various suitable shapes such as a circular shape, a quadrangular shape, and a mesh shape. Also, each of the first cells CL1 and the second cells CL2 may be formed as a single layer or a multi-layer. As such, the shapes and arrangements of the first to qth driving electrodes TX1 to TXq and the first to pth sensing electrodes RX1 to RXp may be variously modified in a suitable manner.

In some embodiments, the first cells CL1 and the second cells CL2 may include at least one of various suitable conductive materials such as a metal material and a transparent conductive material, thereby having conductivity. For example, each of the first cells CL1 and the second cells CL2 may include at least one of various suitable metal materials such as gold (Au), silver (Ag), aluminum (Al), molybdenum (Mo), chromium (Cr), titanium (Ti), nickel (Ni), neodymium (Nd), copper (Cu), and platinum (Pt), or alloys thereof.

The touch array 141 may further include input pads IPD connected to the first to qth driving lines TXL1 to TXLq. The touch driver 171 may be connected to the first to qth driving lines TXL1 to TXLq through the input pads IPD.

The touch array 141 may further include output pads OPD connected to the first to pth sensing lines RXL1 to RXLp. The touch driver 171 may be connected to the first to pth sensing lines RXL1 to RXLp through the output pads OPD.

The touch array 141 may include first touch electrodes and second touch electrodes forming mutual capacitances with the first touch electrodes. The first touch electrodes may be provided as the first to qth driving electrodes TX1, TX2, TX3, . . . , TX(q−1), and TXq. The second touch electrodes may be provided as the first to pth sensing electrodes RX1, RX2, . . . , RX(p−2), RX(p−1), and RXp. The first to qth driving electrodes TX1 to TXq may extend in the first direction DR1, and be arranged to be spaced apart from each other in the second direction DR2. The first to pth sensing electrodes RX1 to RXp may extend in the second direction DR2, and be arranged to be spaced apart from each other in the first direction DR1. The first to pth sensing electrodes RX1 to RXp may be electrically separated from the first to qth driving electrodes TX1 to TXq while crossing the first to qth driving electrodes TX1 to TXq, to form mutual capacitances with the first to qth driving electrodes TX1 to TXq.

When a touch is provided to the touch array 141, one or more of the mutual capacitances may be changed. For example, the touch may include at least one of various suitable types of inputs causing a change in mutual capacitance, such as physical contact and hovering. The touch driver 171 may recognize the touch by sensing the change in mutual capacitance.

The touch driver 171 may be connected to the first to qth driving electrodes TX1 to TXq through the first to qth driving lines TXL1 to TXLq. The touch driver 171 may be connected to the first to pth sensing electrodes RX1 to RXp through the first to pth sensing lines RXL1 to RXLp.

The touch driver 171 may sense sensing signals from the first to pth sensing electrodes RX1 to RXp through the first to pth sensing lines RXL1 to RXLp while applying driving signals to the first to qth driving electrodes TX1 to TXq through the first to qth driving lines TXL1 to TXLq. The touch driver 171 may change in mutual capacitance, based on the sensing signals. Also, the touch driver 171 may recognize a touch by sensing the change in mutual capacitance.

Figure 5:
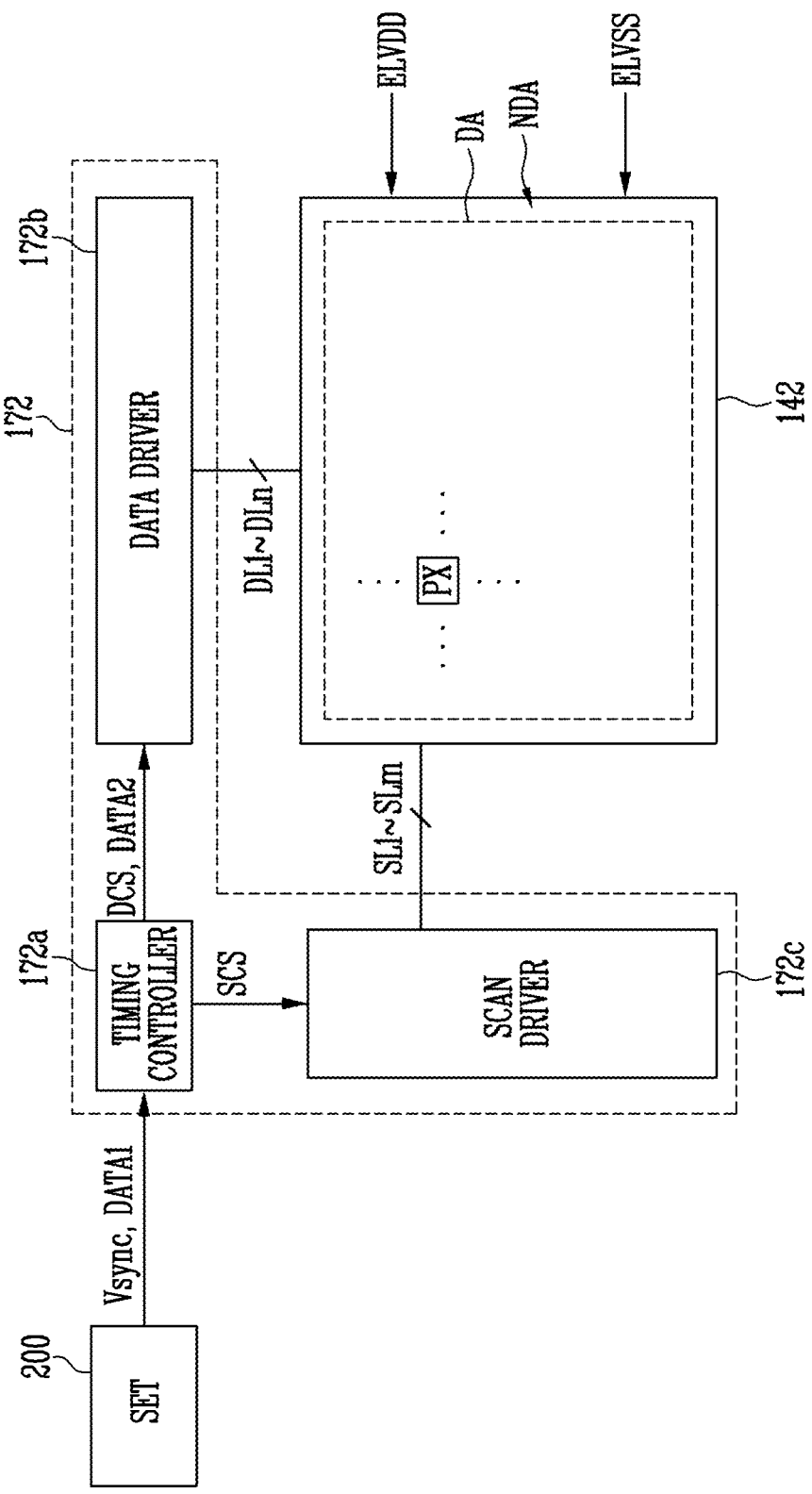
FIG. 5 is a block diagram illustrating a set, a display driver, and a display module of the display device of FIG. 3, according to some embodiments of the present disclosure.

FIG. 5 is a block diagram illustrating the set, the display driver, and the display module, which are shown in FIG. 3, according to some embodiments of the present disclosure.

Referring to FIGS. 3 and 5, the display driver 172 may include a timing controller 172a, a data driver 172b, and a scan driver 172c.

The display driver 172 may receive external signals from the set 200. The display driver 172 may receive first image data DATA1 as an external signal. In some embodiments, the set 200 may include an application processor, a central processing unit (CPU), or the like, which controls the display driver 172. In some embodiments, the set 200 may include a graphic processing unit (GPU) which controls the display driver 172. Besides, the set 200 may include at least one of various suitable devices, which provide the first image data DATA1 to the display driver 172.

The timing controller 172a may generate control signals for controlling the data driver 172b and the scan driver 172c based on (e.g., using) the received external signals. For example, the control signals may include a scan driver control signal SCS for controlling the scan driver 172c and a data driver control signal DCS for controlling the data driver 172b. The external signals may include a vertical synchronization signal Vsync. For example, the vertical synchronization signal Vsync is a signal for synchronizing image data, and may be, as a signal for distinguishing frames, a signal input using one frame as a cycle. However, embodiments of the present disclosure are not limited thereto. For example, the vertical synchronization signal Vsync may be internally generated in the timing controller 172a. For example, the timing controller 172a may include a logic circuit which generates the vertical synchronization signal Vsync.

The timing controller 172a may supply the scan driver control signal SCS to the scan driver 172c, and supply the data driver control signal DCS to the data driver 172b. Also, the timing controller 172a may convert the first image data DATA1 input from an outside into second image data DATA2 suitable for specifications of the data driver 172b, and supply the second image data DATA2 to the data driver 172b.

In accordance with some embodiments, the display panel 142 may include pixels PX, and data lines DL and driving lines SL, which are connected to the pixels PX. The data lines DL may include first to nth (where n is a positive integer of 1 or more) data lines DL1 to DLn. The driving lines SL may include first to mth (where m is a positive integer of 1 or more) driving lines SL1 to SLm.

The data driver 172b may receive the data driver control signal DCS and the second image data DATA2 from the timing controller 172a, to generate a data signal. Also, the data driver 172b may supply the generated data signal to the first to nth data lines DL1 to DLn. In order for the data driver 172b to be connected to the first to nth data lines DL1 to DLn, the data driver 172b may be mounted directly on a substrate on which the pixels PX are formed or be connected to the substrate through a separate component such as a flexible circuit board.

The scan driver 172c may supply driving signals to the first to mth driving lines SL1 to SLm in response to the scan driver control signal SCS. For example, the scan driver 172c may sequentially supply the driving signals to the first to mth driving lines SL1 to SLm. In order for the scan driver 172c to be connected to the first to mth driving lines SL1 to SLm, the scan driver 172c may be mounted directly on the substrate on which the pixels PX are formed or be connected to the substrate through a separate component such as a flexible circuit board.

For example, when a driving signal is supplied to a specific driving line, some pixels PX connected to the specific driving line may be supplied with a data signal transferred from the first to nth data lines DL1 to DLn. The some pixels PX may emit light with a luminance corresponding to the data signal.

Although the timing controller 172a, the data driver 172b, and the scan driver 172c are individually illustrated in FIG. 5, at least some of the components may be integrated, if desired.

An electrode to which a voltage and/or a signal for driving the display panel 142 are/is supplied may be referred to as a panel electrode. The panel electrode may correspond to the data lines DL, the driving lines, a first power source ELVDD, a second power source ELVSS, or the like. A driving voltage may be supplied to the panel electrode. For example, by a current flowing from the first power source ELVDD to the second power source ELVSS via a light emitting element, each of the pixels PX may generate light corresponding to a data signal. The first power source ELVDD may be a high-potential voltage, and the second power source ELVSS may be a low-potential voltage.

FIG. 6 is a schematic view illustrating the plate, an adhesive layer, and a printed circuit board of the display device shown in FIG. 1, which are viewed in the first direction, according to some embodiments of the present disclosure.

Referring to FIGS. 1 and 6, a display device DD may include a plate 150, an adhesive layer 160, and a printed circuit board 170. The adhesive layer 160 may include a first adhesive layer 161 and a second adhesive layer 162.

The first adhesive layer 161 may include a first tape 300 (see, e.g., FIG. 7). The second adhesive layer 162 may include a second tape 400 (see, e.g., FIG. 8). The first tape 300 constituting the first adhesive layer 161 and the second tape 400 constituting the second adhesive layer 162 will be described later with reference to FIGS. 7 and 8.

The first adhesive layer 161 may have adhesion on only one surface. Therefore, the first adhesive layer 161 may be attached to only the printed circuit board 170.

On the other hand, the second adhesive layer 162 may have adhesion on both one surface and the other surface facing the one surface. Therefore, the second adhesive layer 162 may be attached to both the plate 150 and the printed circuit board 170. Accordingly, the plate 150 and the printed circuit board 170 may be attached to each other through the second adhesive layer 162.

The first adhesive layer 161 may include polyethylene terephthalate (PET). The first adhesive layer 161 may absorb a pressure applied toward the first adhesive layer 161.

In a fastening process of the display connector 180 and the set connector 220, the pressurized region PR may be a region to which the unintended pressure Pressure is applied.

In the pressurized region PR of the display module 100 in accordance with the embodiment of the present disclosure, the first adhesive layer 161 and the second adhesive layer 162 may be disposed while being mixed together. The first adhesive layer 161 disposed in the pressurized region PR may absorb the pressure Pressure applied to the pressurized region PR. Accordingly, as the pressure Pressure transferred to the protective layer 110 is reduce (e.g., minimized), damage of the protective layer 110 can be prevented or substantially reduced.

The arrangement of the first adhesive layer 161 and the second adhesive layer 162 in the pressurized region PR will be described in further detail later with reference to FIG. 9.

FIG. 7 is a schematic view illustrating a first tape constituting the first adhesive layer shown in FIG. 6, according to some embodiments of the present disclosure.

Referring to FIGS. 6 and 7, the first adhesive layer 161 may include the first tape 300. The first tape 300 may include a first conductive adhesive 310 and a first material layer 320.

The first conductive adhesive 310 may overlap with the first material layer 320.

The first conductive adhesive 310 may include an epoxy resin. In addition, a first upper surface US1 of the first tape 300 may have adhesion. On the other hand, a first lower surface LS1 of the first tape 300 may have no adhesion. In other words, the first tape 300 may be a single-sided tape.

The first material layer 320 may include polyethylene terephthalate (PET). The first material layer 320 may absorb a pressure applied toward the first material layer 320. Because the first adhesive layer 161 includes the first material layer 320, the first adhesive layer 161 may absorb a pressure applied toward the first adhesive layer 161. The first material layer 320 may have excellent durability against pressure as compared with a second material layer 420 (see, e.g., FIG. 8).

In some embodiments, the first tape 300 may have a white color.

Figure 8:
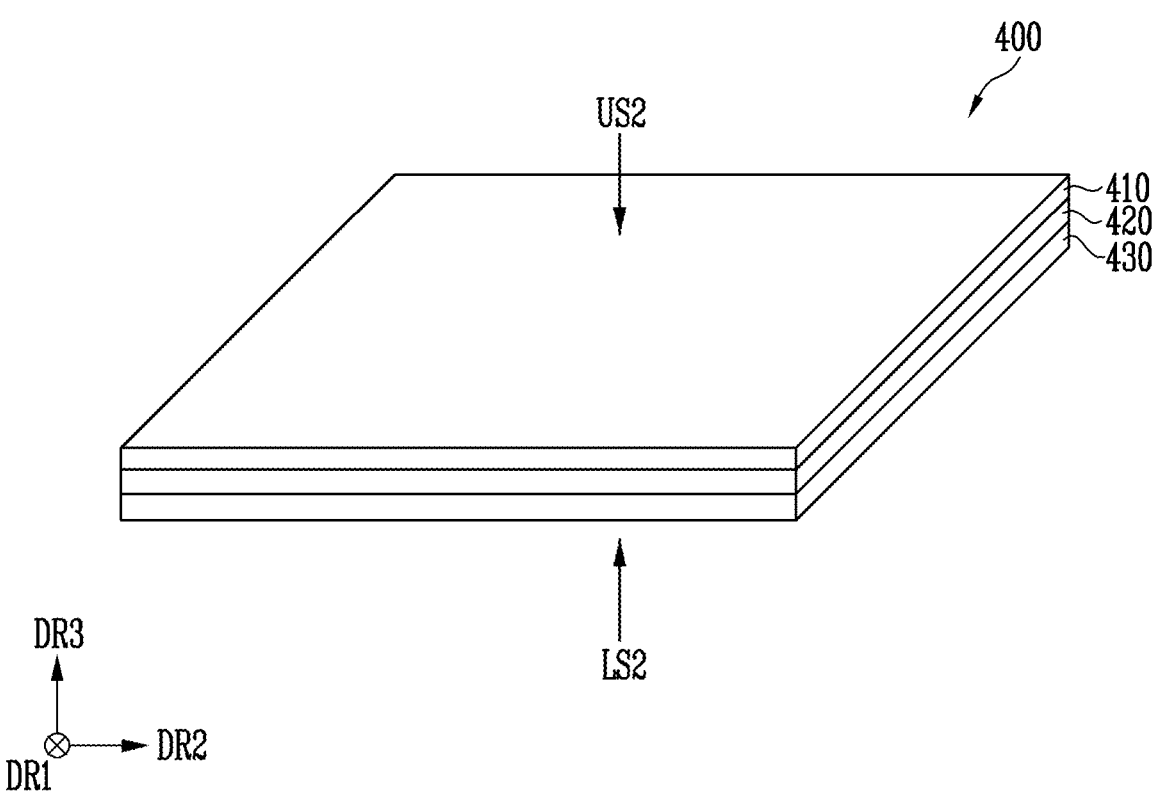
FIG. 8 is a schematic view illustrating a second tape constituting a second adhesive layer shown in FIG. 6, according to some embodiments of the present disclosure.

FIG. 8 is a schematic view illustrating a second tape constituting the second adhesive layer shown in FIG. 6, according to some embodiments of the present disclosure.

Referring to FIGS. 6 and 8, the second adhesive layer 162 may include the second tape 400. The second adhesive layer 162 may include a second conductive adhesive 410, the second material layer 420, and a third conductive adhesive 430.

The second material layer 420 may be disposed between the second conductive adhesive 410 and the third conductive adhesive 430.

The second conductive adhesive 410 and the third conductive adhesive 430 may include an epoxy resin. In addition, a second upper surface US2 of the second tape 400 and a second lower surface LS2 of the second tape 400 may have adhesion. In other words, the second tape 400 may be a double-sided tape with adhesion on both sides. Because the second adhesive layer 162 includes the second conductive adhesive 410 and the third conductive adhesive 430, the second adhesive layer 162 may be attached to the plate 150 and the printed circuit board 170.

The second material layer 420 may include a non-woven fabric. The second material layer 420 may not have excellent durability against pressure as compared with the first material layer 320 (see, e.g., FIG. 7).

In some embodiments, the second tape 400 may have a black color.

Figure 9:
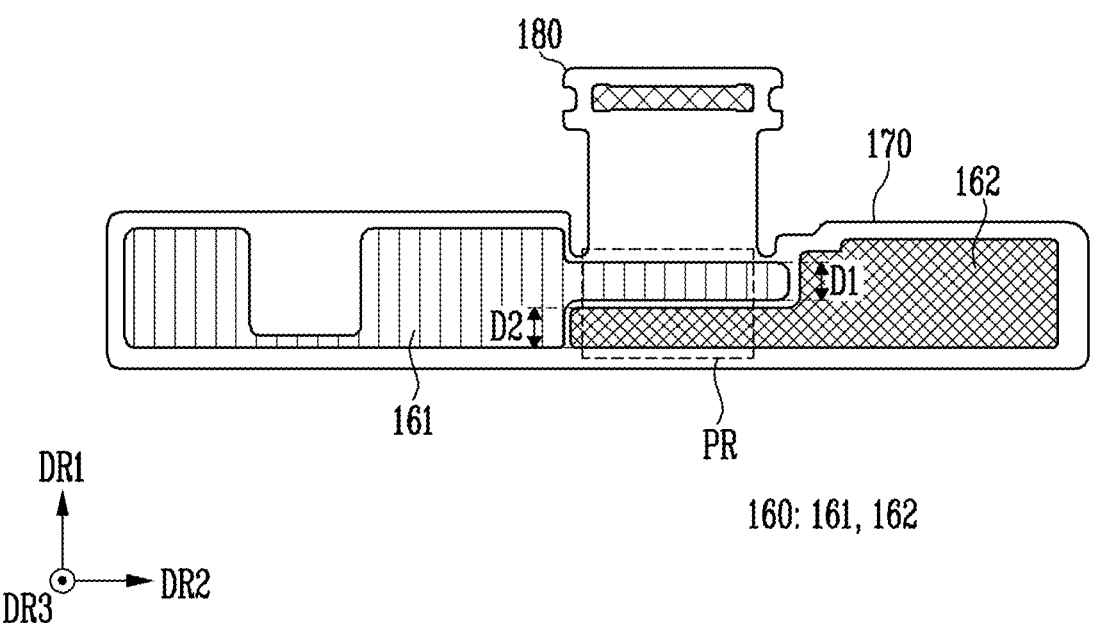
FIG. 9 is a schematic view illustrating an adhesive layer, a printed circuit board, and a display connector of the display device shown in FIG. 1, which are viewed in a third direction, according to some embodiments of the present disclosure.

FIG. 9 is a schematic view illustrating an adhesive layer, a printed circuit board, and a display connector of the display device shown in FIG. 1, which are viewed in the third direction, according to some embodiments of the present disclosure.

Referring to FIGS. 1 and 9, a display device DD may include an adhesive layer 160, a printed circuit board 170, and a display connector 180.

Figure 11:
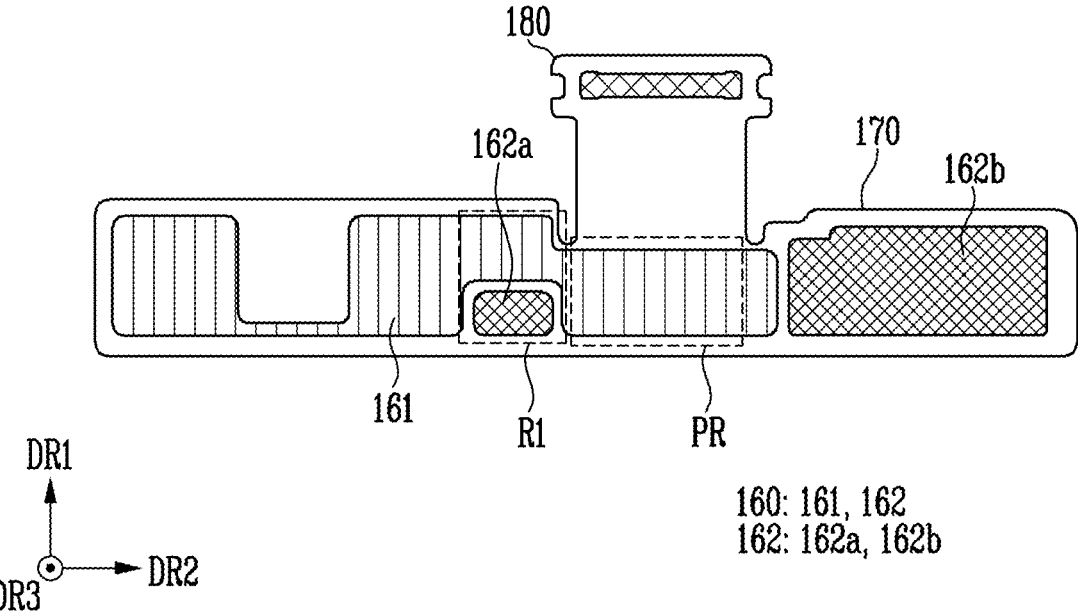
FIG. 11 is a schematic view illustrating an adhesive layer, a printed circuit board, and a display connector of the display device shown in FIG. 1, which are viewed in the third direction, according to some embodiments of the present disclosure.
Figure 12:
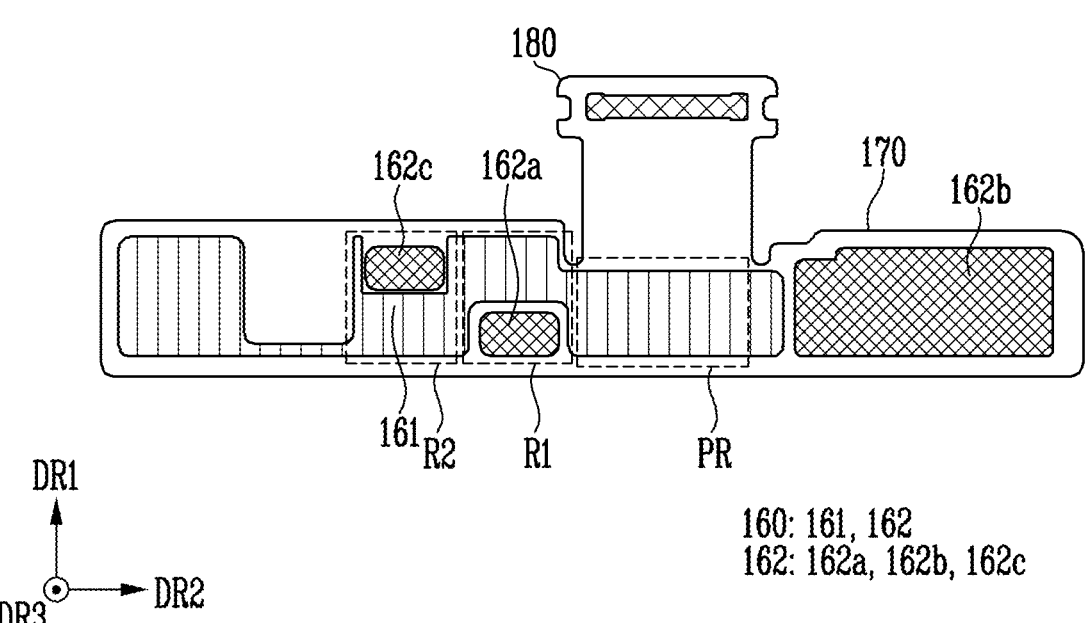
FIG. 12 is a schematic view illustrating an adhesive layer, a printed circuit board, and a display connector of the display device shown in FIG. 1, which are viewed in the third direction, according to some embodiments of the present disclosure.

After the fastening process of the display connector 180 and the set connector 220 is made, the display connector 180 may be bent as shown in FIG. 2, to overlap with the pressurized region PR. FIGS. 9, 11, and 12 illustrate the display device DD before the fastening process of the display connector 180 and the set connector 220 is made.

The adhesive layer 160 may include a first adhesive layer 161 and a second adhesive layer 162.

As shown in FIG. 9, the first adhesive layer 161 and the second adhesive layer 162 may be disposed while being mixed together in the pressurized region PR. For example, in the pressurized region PR, the first adhesive layer 161 and the second adhesive layer 162 may overlap with each other while being spaced apart from each other at a predetermined distance in the first direction DR1.

In the pressurized region PR, a width of the first adhesive layer 161 in the first direction DR1 may be a first length D1. In the pressurized region PR, a width of the second adhesive layer 162 in the first direction DR1 may be a first length D2. In some embodiments, the first length D1 may be greater than the second length D2.

In a region except the pressurized region PR, the first adhesive layer 161 and the second adhesive layer 162 may not be disposed while being mixed together. For example, the second adhesive layer 162 may be disposed in a region located in the second direction DR2 from the pressurized region PR. For example, the first adhesive layer 161 may be disposed in a region located in the opposite direction of the second direction DR2 from the pressurized region PR.

In the pressurized region PR of the display device DD in accordance with the embodiment of the present disclosure, the first adhesive layer 161 and the second adhesive layer 162 may be disposed while being mixed together. The first adhesive layer 161 disposed in the pressurized region PR may absorb the pressure Pressure applied to the pressurized region PR. Accordingly, as the pressure Pressure transferred to the protective layer 110 is reduce (e.g., minimized), damage of the protective layer 110 can be prevented or substantially reduced.

Figure 10:
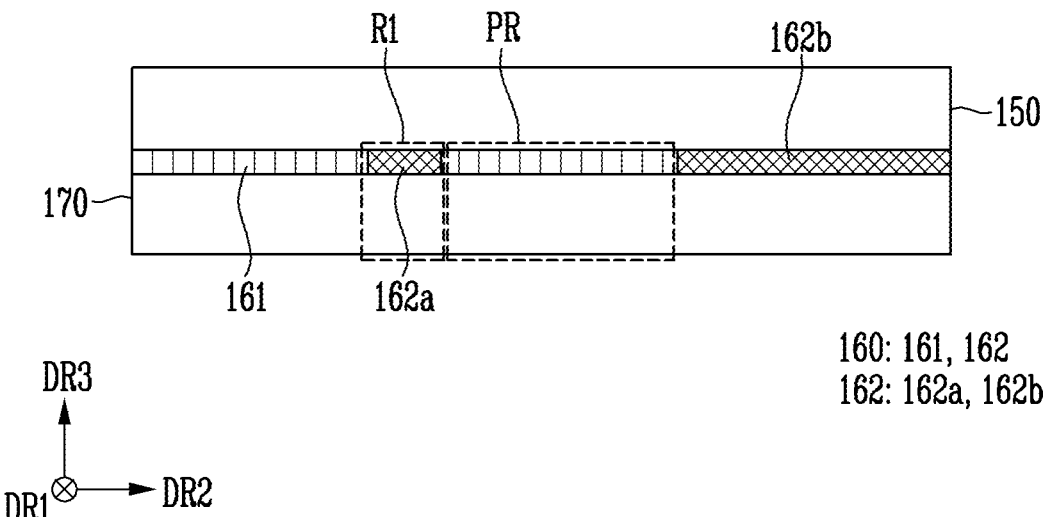
FIG. 10 is a schematic view illustrating a plate, an adhesive layer, and a printed circuit board of the display device shown in FIG. 1, which are viewed in the first direction, according to some embodiments of the present disclosure.

FIG. 10 is a schematic view illustrating a plate, an adhesive layer, and a printed circuit board of the display device shown in FIG. 1, which are viewed in the first direction, according to some embodiments of the present disclosure.

Referring to FIGS. 1 and 10, a display device DD may include a plate 150, an adhesive layer 160, and a printed circuit board 170. The adhesive layer 160 may include a first adhesive layer 161 and a second adhesive layer 162. The second adhesive layer 162 may include a first sub-adhesive layer 162a and a second sub-adhesive layer 162b. The second sub-adhesive layer 162b may be disposed to be spaced apart from the first sub-adhesive layer 162a.

The first adhesive layer 161 may include the first tape 300 (see, e.g., FIG. 7). Each of the first sub-adhesive layer 162a and the second sub-adhesive layer 162b may include the second tape 400 (see, e.g., FIG. 8).

The first adhesive layer 161 may have adhesion on only one surface. Therefore, the first adhesive layer 161 may be attached to only the printed circuit board 170.

On the other hand, each of the first sub-adhesive layer 162a and the second sub-adhesive layer 162b may have adhesion on both one surface and the other surface facing the one surface. Therefore, each of the first sub-adhesive layer 162a and the second sub-adhesive layer 162b may be attached to both the plate 150 and the printed circuit board 170. Accordingly, the plate 150 and the printed circuit board 170 may be attached to each other through each of the first sub-adhesive layer 162a and the second sub-adhesive layer 162b.

The first adhesive layer 161 may include polyethylene terephthalate (PET). The first adhesive layer 161 may absorb a pressure applied toward the first adhesive layer 161.

In the fastening process of the display connector 180 and the set connector 220, the pressure region PR may be a region to which an unintended pressure Pressure is applied.

In the pressurized region PR of the display module 100 in accordance with the embodiment of the present disclosure, only the first adhesive layer 161 may be disposed. The first adhesive layer 161 disposed in the pressurized region PR may absorb the pressure Pressure applied to the pressurized region PR. Accordingly, as the pressure Pressure transferred to the protective layer 110 is reduce (e.g., minimized), damage of the protective layer 110 can be prevented or substantially reduced.

In addition, in the display module 100 in accordance with the embodiment of the present disclosure, the first sub-adhesive layer 162a and first adhesive layer 161 may be disposed while being mixed together in a region (e.g., a first region R1) except the pressurized region PR. Accordingly, adhesion between the plate 150 and the printed circuit board 170 can be reinforced.

The arrangement of the first adhesive layer 161, the first sub-adhesive layer 162a, and the second sub-adhesive layer 162b will be described in further detail later with reference to FIG. 11.

FIG. 11 is a schematic view illustrating an adhesive layer, a printed circuit board, and a display connector of the display device shown in FIG. 1, which are viewed in the third direction, according to some embodiments of the present disclosure.

Referring to FIGS. 1, 10, and 11, a display device DD may include an adhesive layer 160, a printed circuit board 170, and a display connector 180.

The adhesive layer 160 may include a first adhesive layer 161 and a second adhesive layer 162. The second adhesive layer 162 may include a first sub-adhesive layer 162a and a second sub-adhesive layer 162b.

As shown in FIG. 11, only the first adhesive layer 161 may be disposed in the pressurized region PR. The first adhesive layer 161 disposed in the pressurized region PR may absorb the pressure Pressure applied to the pressurized region PR. Accordingly, as the pressure Pressure transferred to the protective layer 110 is reduce (e.g., minimized), damage of the protective layer 110 can be prevented or substantially reduced.

On the other hand, a first region R1 may be located in the opposite direction of the second direction DR2 from the pressurized region PR. In the first region R1, the first adhesive layer 161 and the first sub-adhesive layer 162a may be disposed while being mixed together. For example, in the first region R1, a portion of the first adhesive layer 161 and the first sub-adhesive layer 162a may overlap with each other at three surfaces in the first and second directions DR1 and DR2. In the first region R1, the first sub-adhesive layer 162a and the first adhesive layer 161 are disposed while being mixed together, so that the adhesion between the plate 150 and the printed circuit board 170 can be reinforced.

In a region except the first region R1, the first adhesive layer 161 and the second adhesive layer 162 may not be disposed while being mixed together. In a region located in the second direction DR2 from the pressurized region PR, the second sub-adhesive layer 162b may be disposed. For example, the first adhesive layer 161 may be disposed in the pressurized region PR. For example, the first adhesive layer 161 may be disposed in a region except the first region R1 in a region located in the opposite direction of the second direction DR2 from the pressurized region PR.

FIG. 12 is a schematic view illustrating an adhesive layer, a printed circuit board, and a display connector of the display device shown in FIG. 1, which are viewed in the third direction, according to some embodiments of the present disclosure.

Referring to FIGS. 1 and 12, a display device DD may include an adhesive layer 160, a printed circuit board 170, and a display connector 180.

The adhesive layer 160 may include a first adhesive layer 161 and a second adhesive layer 162. The second adhesive layer 162 may include a first sub-adhesive layer 162a, a second sub-adhesive layer 162b, and a third sub-adhesive layer 162c.

As shown in FIG. 12, only the first adhesive layer 161 may be disposed in the pressurized region PR. The first adhesive layer 161 disposed in the pressurized region PR may absorb the pressure Pressure applied to the pressurized region PR. Accordingly, as the pressure Pressure transferred to the protective layer 110 is reduce (e.g., minimized), damage of the protective layer 110 can be prevented or substantially reduced.

On the other hand, a first region R1 may be located in the opposite direction of the second direction DR2 from the pressurized region PR. In the first region R1, the first adhesive layer 161 and the first sub-adhesive layer 162*a* may be disposed while being mixed together. For example, in the first region R1, a portion of the first adhesive layer 161 and the first sub-adhesive layer 162*a* may overlap with each other at three surfaces in the first and second directions DR1 and DR2. In the first region R1, the first sub-adhesive layer 162*a* and the first adhesive layer 161 are disposed while being mixed together, so that the adhesion between the plate 150 and the printed circuit board 170 can be reinforced.

A second region R2 different from the first region R1 may be located in the opposite direction of the second direction DR2 from the pressurized region PR. In the second region R2, the first adhesive layer 161 and the third sub-adhesive layer 162*c* may be disposed while being mixed together. For example, in the second region R2, a portion of the first adhesive layer 161 and the third sub-adhesive layer 162*c* may overlap with each other at three surfaces in the first and second directions DR1 and DR2.

The display device in accordance with the still other embodiments of the present disclosure may further include the second region R2 as compared with the display device in accordance with the other embodiments of the present disclosure. In the second region R2, the third sub-adhesive layer 162*c* and the first adhesive layer 161 are disposed while being mixed together, so that the adhesion between the plate 150 and the printed circuit board 170 can be further reinforced as compared with the display device in accordance with the some other embodiments of the present disclosure.

In a region except the first region R1 and the second region R2, the first adhesive layer 161 and the second adhesive layer 162 may not be disposed while being mixed together. In a region located in the second direction DR2 from the pressurized region PR, the second sub-adhesive layer 162*b* may be disposed. For example, the first adhesive layer 161 may be disposed in the pressurized region PR. For example, the first adhesive layer 161 may be disposed in a region except the first region R1 and the second region R2 in a region located in the opposite direction of the second direction DR2 from the pressurized region PR.

In the display module and the display device including the same in accordance with the present disclosure, the durability of the display module is enhanced, so that the display module can be prevented from being damages or pressed due to pressure, or such damage may be significantly reduced.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with some other embodiments unless otherwise specifically indicated. Accordingly, it will be understood by those of skill in the art that various suitable changes in form and details may be made without departing from the spirit and scope of the present disclosure as set forth in the following claims and equivalents thereof.

What is claimed is:

1. A display module comprising:
a panel comprising a plurality of pixels;
a plate overlapping with the panel, the plate configured to protect the panel from external impact;
a printed circuit board configured to generate signals for driving the plurality of pixels; and
an adhesive layer between the plate and the printed circuit board, the adhesive layer and the printed circuit board overlapping each other in a third direction,
wherein the adhesive layer comprises:
a first adhesive layer; and
a second adhesive layer adhering the plate and the printed circuit board to each other, and
wherein, in a partial region of the adhesive layer, the first adhesive layer and the second adhesive layer overlap each other in a first direction perpendicular to the third direction, are separated at a distance along the first direction, and are configured to mixed together under pressure.

2. The display module of claim 1, wherein, in the partial region of the adhesive layer, a width of the first adhesive layer in the first direction is greater than a width of the second adhesive layer in the first direction.

3. The display module of claim 1, wherein, in a region except the partial region of the adhesive layer, any one of the first adhesive layer and the second adhesive layer is positioned.

4. The display module of claim 1, wherein the first adhesive layer comprises:
a first material layer; and
a first conductive adhesive having adhesion, and
wherein the first adhesive layer is attached to the printed circuit board through the first conductive adhesive.

5. The display module of claim 4, wherein the second adhesive layer comprises:
a second conductive adhesive and a third conductive adhesive, which have adhesion; and
a second material layer between the second conductive adhesive and the third conductive adhesive.

6. The display module of claim 5, wherein the first material layer comprises polyethylene terephthalate (PET), and
wherein the second material layer comprises a non-woven fabric.

7. The display module of claim 1, wherein the second adhesive layer comprises a first sub-adhesive layer and a second sub-adhesive layer separated from the first adhesive layer.

8. The display module of claim 7, wherein, in a region except the partial region of the adhesive layer, any one of the first adhesive layer and the second sub-adhesive layer is positioned.

9. The display module of claim 7,
wherein, in the partial region of the adhesive layer, the first adhesive layer and the first sub-adhesive layer overlap each other at three surfaces in the first direction and a second direction crossing the third direction.

10. The display module of claim 7, wherein the second adhesive layer further comprises the first sub-adhesive layer and a third sub-adhesive layer spaced apart from the second sub-adhesive layer, wherein the partial region of the adhesive layer comprises a first region and a second region not overlapping with the first region, wherein, in the first region, the first adhesive layer and the first sub-adhesive layer are positioned while being mixed together, and wherein, in the second region, the first adhesive layer and the third sub-adhesive layer are positioned and configured to be mixed together under pressure.

11. A display device comprising:

a display module configured to display an image; and a set configured to provide external signals to the display module, wherein the display module comprises:

a panel comprising a plurality of pixels;

a plate overlapping with the panel, the plate configured to protect the panel from external impact;

a printed circuit board configured to generate signals for driving the plurality of pixels based on the external signals; and an adhesive layer between the plate and the printed circuit board, the adhesive layer and the printed circuit board overlapping each other in a third direction, wherein the adhesive layer comprises:

a first adhesive layer; and a second adhesive layer adhering the plate and the printed circuit board to each other, and wherein, in a partial region of the adhesive layer, the first adhesive layer and the second adhesive layer overlap each other in a first direction perpendicular to the third direction, are separated at a distance along the first direction, and are configured to mixed together under pressure.

12. The display device of claim 11, wherein the display module further comprises a display connector electrically connected to the printed circuit board, wherein the set comprises a set connector connected between the set and the display connector, and wherein the partial region of the adhesive layer overlaps with a position at which the display connector and the set connector are fastened to each other in the third direction.

13. The display device of claim 11, wherein, in the partial region of the adhesive layer, a width of the first adhesive layer in the first direction is greater than a width of the second adhesive layer in the first direction.

14. The display device of claim 11, wherein, in a region except the partial region of the adhesive layer, any one of the first adhesive layer and the second adhesive layer is positioned.

15. The display device of claim 11, wherein the first adhesive layer comprises:

a first material layer; and a first conductive adhesive having adhesion, and wherein the first adhesive layer is attached to the printed circuit board through the first conductive adhesive.

16. The display device of claim 15, wherein the second adhesive layer comprises:

a second conductive adhesive and a third conductive adhesive, which have adhesion; and a second material layer between the second conductive adhesive and the third conductive adhesive.

17. The display device of claim 16, wherein the first material layer comprises polyethylene terephthalate (PET), and wherein the second material layer comprises a non-woven fabric.

* * * * *